(12) United States Patent
Hua

(10) Patent No.: US 9,101,084 B2  
(45) Date of Patent: Aug. 4, 2015

(54) METHOD OF FABRICATING PCB BOARD AND PCB BOARD

(71) Applicants: PEKING UNIVERSITY FOUNDER GROUP CO., LTD., Beijing (CN); ZHUHAI FOUNDER TECH. MULTILAYER PCB CO., LTD., Zhuhai, Guangdong (CN); ZHUHAI FOUNDER PCB DEVELOPMENT CO., LTD., Zhuhai, Guangdong (CN)

(72) Inventor: Yansheng Hua, Beijing (CN)

(73) Assignees: Peking University Founder Group Co., Ltd., Beijing (CN); Zhuhai Founder Tech. Multilayer PCB Co., Ltd., Zhuhai, Guangdong (CN); Zhuhai Founder PCB Development Co., Ltd., Zhuhai, Guangdong (CN)

( * ) Notice: Subject to any disclaimer, the term of this patent is extended or adjusted under 35 U.S.C. 154(b) by 287 days.

(21) Appl. No.: 13/732,125

(22) Filed: Dec. 31, 2012

(65) Prior Publication Data  
US 2013/0168137 A1 Jul. 4, 2013

(30) Foreign Application Priority Data

Dec. 30, 2011 (CN) .......................... 2011 1 0456089  
Dec. 31, 2011 (CN) .......................... 2011 1 0460352

(51) Int. Cl.  
*H05K 3/46* (2006.01)  
*H05K 1/02* (2006.01)

(52) U.S. Cl.  
CPC ................ *H05K 3/46* (2013.01); *H05K 1/0201* (2013.01); *H05K 1/0204* (2013.01); *H05K 3/4694* (2013.01); *H05K 3/4611* (2013.01); *H05K 2201/10416* (2013.01); *Y10T 156/1056* (2015.01)

(58) Field of Classification Search  
USPC .......................................... 174/252; 156/252  
See application file for complete search history.

(56) References Cited

U.S. PATENT DOCUMENTS

2003/0122240 A1* 7/2003 Lin et al. ........................ 257/686  
2005/0202787 A1* 9/2005 Coleman et al. .............. 455/90.3

* cited by examiner

*Primary Examiner* — Timothy Thompson  
*Assistant Examiner* — Charles Pizzuto  
(74) *Attorney, Agent, or Firm* — Finnegan, Henderson, Farabow, Garrett & Dunner, LLP

(57) ABSTRACT

A method of fabricating a printed circuit board is disclosed. The method includes opening a first window in a first base board and opening a second window in a second base board and a resin layer. The resin layer is between the second base board and the first base board. The method further includes bonding the first base board and the second base board through the resin layer; placing a heat dissipating conductor in the first window in the first base board through the second window; placing a resin portion on the first base board in the second window; embedding a sub-board in the second window of the second base board; and bonding the sub-board with the first base board through the resin portion.

15 Claims, 8 Drawing Sheets

METHOD OF FABRICATING PCB BOARD AND PCB BOARD

CROSS REFERENCE OF RELATED APPLICATIONS

This application claims the benefit of Chinese Patent Application Nos. 201110456089.9 filed on Dec. 30, 2011, and 201110460352.1, filed on Dec. 31, 2011, all of which are incorporated by reference in their entirety.

TECHNICAL FIELD

The present invention relates to manufacturing a printed circuit board (PCB) and particularly to a method of fabricating a PCB board and a PCB board.

BACKGROUND

Along with the development of high frequency electronic devices and the development of wireless networks and satellite communication devices, it has been a trend that information products have high speeds and high frequencies and that communication products transmit standardized voice, video and data wirelessly at large capacities and high speeds. Base boards required for new-generation communication products also have to fit the development trend thereof, and traditional FR-4 materials have been found difficult to meet the existing requirements. In a traditional process of fabricating a printed circuit board (PCB), if a high frequency signal will be used, the entire board has to be made of a material suitable for high frequency applications. If the high frequency signal is required to be used on a portion of a board (generally in an area less than one third of the entire board), only a portion of the board would use the high frequency material (generally in an area less than one third of the entire board) to reduce the usage amount of the costly high frequency board material, thus greatly reducing the cost of a PCB.

Also, only a fraction of electric energy consumed by electronic elements in operation is used to drive the electronic elements, and most of the electric energy is transformed into heat. The heat rapidly increases the temperature of the electronic elements. If the heat is not timely dissipated, the temperature of the electronic elements might constantly increase, thus resulting in decreased reliability and even failure of the electronic elements due to being overheated. It may not be sufficient to depend on self-dissipation of heat for an electronic element generating a large amount of heat. One method to address the issue of heat dissipation of a high power device is to bury a copper conductor in the board. A board having a portion of hybrid lamination and a buried copper conductor may solve the issue of high frequency signal transmission delay and heat dissipation of a high power device. With these structures, the board may meet the requirements of electrical performance of a product and the cost thereof can be saved.

There are two conventional methods for fabricating a board having a portion of hybrid lamination and a buried copper conductor:

The first method is a Mas Lam lamination process. This method includes a process of bonding individual base substrates with gel/resin to form boards and a process of stacking the boards. An arrangement of bonding individual base substrates with gel/resin may be: L1/L2 base substrate-resin layer-L3/L4 base substrate-resin layer-L5/L6 base substrate-resin layer-L7/L8 base substrate-resin layer-L9/L10 base substrate-resin layer-L11/L12 base substrate. A process of stacking the bonded boards may be: (1) preparing a bonded board; (2) burying copper conductor in the board; (3) attaching a release film to the board; (4) attaching an aluminum sheet to the board; (5) attaching a steel sheet to the board; (6) turning the board over; (7) burying a high frequency sub-board in the board; (8) attaching another release film to the board; (9) attaching an aluminum sheet to the board; and (10) attaching a steel sheet to the board.

The second method is a Pin Lam lamination process, i.e., a method of directly stacking boards. In a laminating process of, for example, a 12-layer (12L) board having a portion of hybrid lamination and a buried copper conductor, layers in the board may be arranged in the following order: steel board-aluminum sheet-release film-L12/L11 base substrate-high frequency sub-board-resin layer-L10/L9 base substrate-resin layer-L8/L7 base substrate-resin layer-L6/L5 base substrate-resin layer-L4/L3 base substrate-resin layer-L2/L1 base substrate-buried copper conductor-release film-aluminum sheet.

In the first method, two processes as described above have to be performed, and the board has to be flipped over in the board stacking process. This may potentially result in an inefficient production, a considerable amount of labor, and instable product quality.

In the second method, boards may not necessarily be pre-bonded because a Pin Lam processing equipment will perform the alignment among base substrates and elements using pins. But the Pin Lam processing equipment is expensive and may be inefficient and costly.

SUMMARY

A method for fabricating a PCB is provided below. In some embodiments, the method includes opening a first window in a first base board (e.g., a stacked base board). The stacked base board includes base substrates and at least a first resin layer interposed between the base substrates. The method further includes opening a second window in a second base board and a second resin layer. The second resin layer is between the second base board and the stacked base board. In some embodiments, when opening the second window, edges of the second resin layer in the second window are cut, leaving an edge connected with the second resin layer, thus forming a bendable resin portion in the second window. The method further includes bonding the stacked base board and the second base board through the second resin layer; bending the bendable resin portion of the second resin layer in the second window; and placing the heat dissipating conductor in the first window in the stacked base board through the second window. The heat dissipating conductor can be made from, for example, copper, or other heat conducting materials. The method further includes embedding the sub-board in the second window of the second base board; and bonding the sub-board with the stacked base board through the bendable resin portion of the second resin layer.

In some other embodiments, when opening the second window, the second resin layer in the second window are cut through to obtain a separate resin portion. After the heat dissipating conductor is placed in the first window, the separate resin portion is placed back on the stacked base board.

In one embodiment, the method includes forming an opening matching in location, shape, and size with the heat dissipating copper conductor in the sub-board.

In another embodiment, the number of heat dissipating copper conductors is more than one, and the number of first windows is set consistent with the number of heat dissipating copper conductors.

In one embodiment, the boundary of the first window is within the boundary of the second window.

In another embodiment, the size of the first window is larger than the size of the heat dissipating copper conductor by 3-6 mils.

In another embodiment, the size of the second window is larger than the size of the sub-board by 3-6 mils.

According to some other embodiments, a printed circuit board (PCB) is provided. The PCB includes a stacked base board. The stacked base board includes at least two base substrates, a first resin layer sandwiched between the base substrates, and a first window traversing the base substrates and the first resin layer. The PCB further includes a heat dissipating copper conductor buried in the first window and a second base board on the stacked base board. The second base board has a second window corresponding to the first window. The PCB further includes a sub-board embedded in the second window in the second base board. A shape and size of the sub-board matches with a shape and size of the second window. The PCB further includes a second resin layer interposed between the second base board and the stacked base board and a resin portion interposed between the sub-board and the stacked base board. The resin portion may be an extension from the second resin layer, or a separate resin portion, for example, cut from the second resin layer when opening the second window.

In one embodiment, the sub-board includes an opening matching in location, shape, and size with the heat dissipating copper conductor.

In another embodiment, the number of heat dissipating copper conductors is more than one.

In another embodiment, a size of the second window is larger than a size of the sub-board by 3-6 mils.

In another embodiment, a size of the first window is larger than a size of the heat dissipating copper conductor by 3-6 mils.

According to another embodiment, a resin layer including a bendable portion is provided on a stacked base board. A heat dissipating conductor may be inserted into a window of the stacked base board by bending the bendable portion of the resin layer. Thus, problems in fabricating a hybrid PCB such as requiring a large amount of labor to stack boards, low efficiency, and complicated production schedule due to the need of flipping over boards, may be eased.

Furthermore, the process of opening a window on a resin layer is easier to perform than the process of turning over a stacked board to thereby reduce the technical difficulties in the fabrication process.

BRIEF DESCRIPTION OF THE DRAWINGS

Attached drawings illustrated herein are used to provide further understanding of the invention, which constitute a part of the application. Exemplary embodiments and descriptions thereof are used to explain the invention but not intended to limit the invention.

DETAILED DESCRIPTION OF THE EMBODIMENTS

Figure 1:
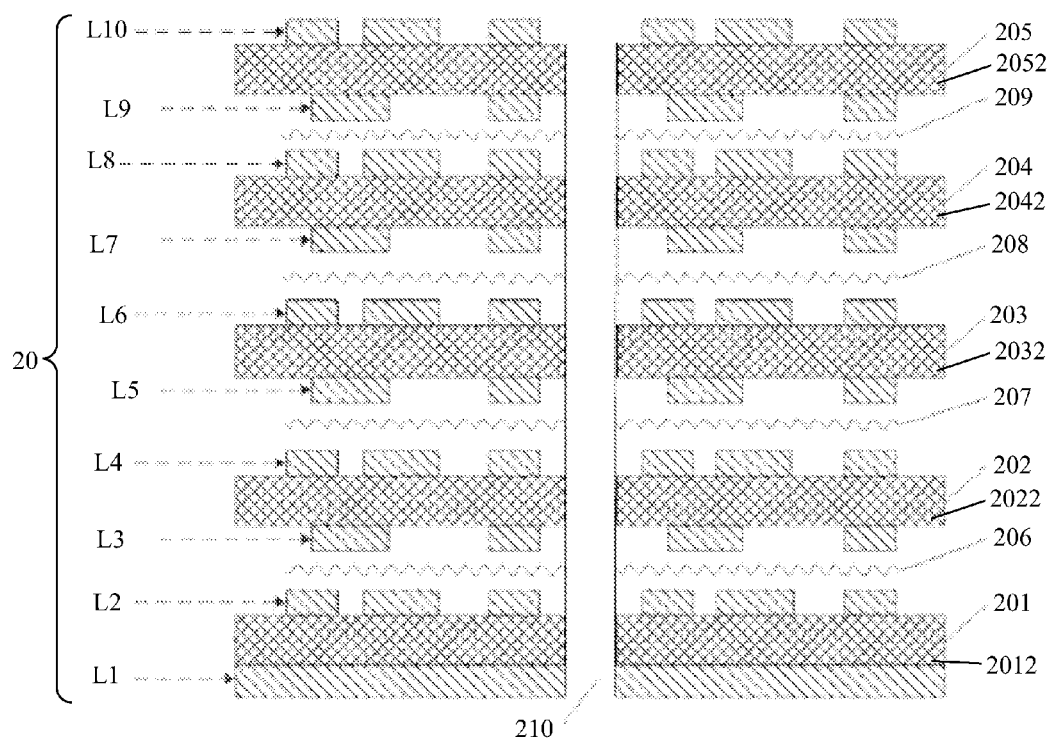
FIG. 1 is a schematic and exploded structural diagram of a stacked base board of a PCB according to an embodiment.

A method of fabricating a PCB board is provided. Particularly, the method is provided for fabricating a board having a portion of hybrid lamination and a buried copper conductor. Structures of a PCB board will be described. PCB board may include, for example, twelve (12) layers of base substrates and a buried copper conductor. Referring to FIG. 1, in one embodiment, PCB board 200 includes a first base board 20. First base board 20 includes: a first base substrate 201 including an insulating layer 2012 and metal (e.g., copper) circuit layers L1, L2 on two sides of insulating layer 2012; a second base substrate 202 including an insulating layer 2022 and metal (e.g., copper) circuit layers L3, L4 on two sides of insulating layer 2022; a third base substrate 203 including an insulating layer 2032 and metal (e.g., copper) circuit layers L5, L6 on two sides of insulating layer 2032; a fourth base substrate 204 including an insulating layer 2042 and metal (e.g., copper) circuit layers L7, L8 on two sides of insulating layer 2042; and a fifth base substrate 205 including an insulating layer 2052 and metal (e.g., copper) circuit layers L9, L10 on two sides of insulating layer 2052.

The first base board 20 further includes: a first resin layer 206 between the first base substrate 201 and the second base substrate 202; a second resin layer 207 between the second base substrate 202 and the third base substrate 203; a third resin layer 208 between the third base substrate 203 and the fourth base substrate 204; and a fourth resin layer 209 between the fourth base substrate 204 and the fifth base substrate 205. Furthermore, as illustrated in FIG. 1, although only one resin layer is arranged between two base substrates, the number of resin layer is not limited. In some embodiments, two or more resin layers may be arranged to interpose between two base substrates.

Figure 2:
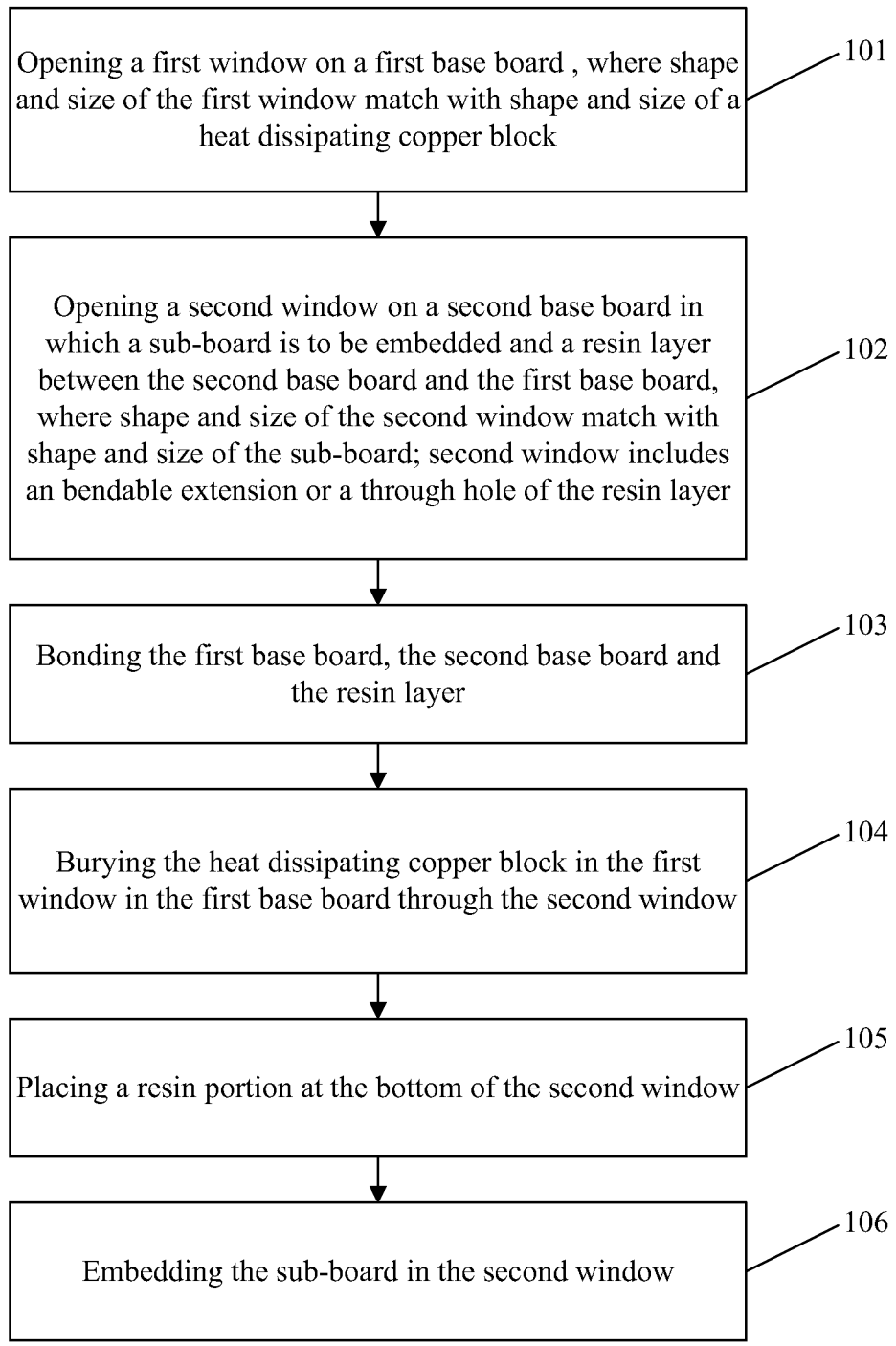
FIG. 2 is a flow chart of a method of fabricating a PCB according to an embodiment.

Referring to FIG. 2, which shows a flow chart of fabricating a PCB board according to another embodiment.

At step 101, a first window is opened in a first base board which includes one or more base substrates and one or more resin layers, where the shape and size of the first window match with the shape and size of a heat dissipating copper conductor.

At step 102, a second window is opened in a second base board in which a sub-board is to be embedded and a resin layer between the second base board and the first base board, where the shape and size of the second window match with the shape and size of the sub-board.

Figure 3A:
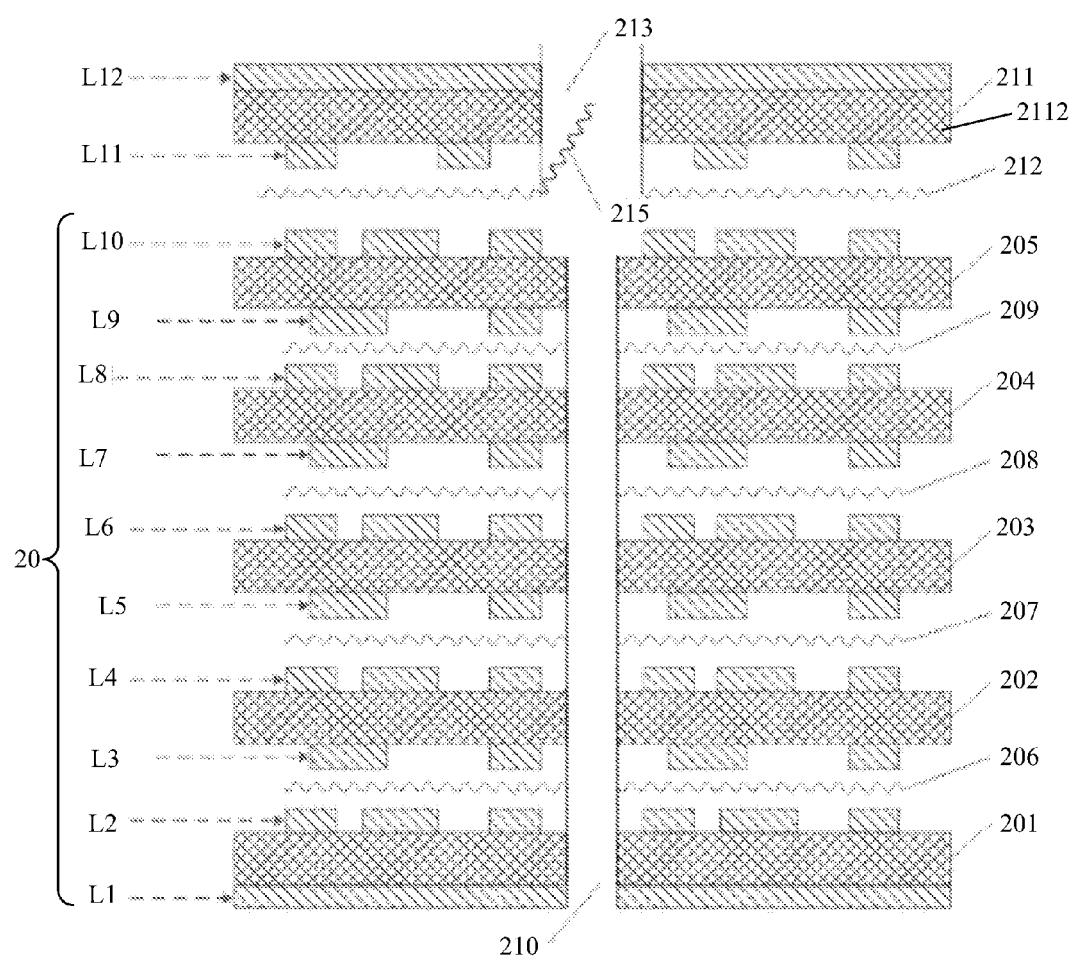
FIG. 3a is a schematic and exploded structural diagram of a stacked base board and a second base board of a PCB according to an embodiment.
Figure 3B:
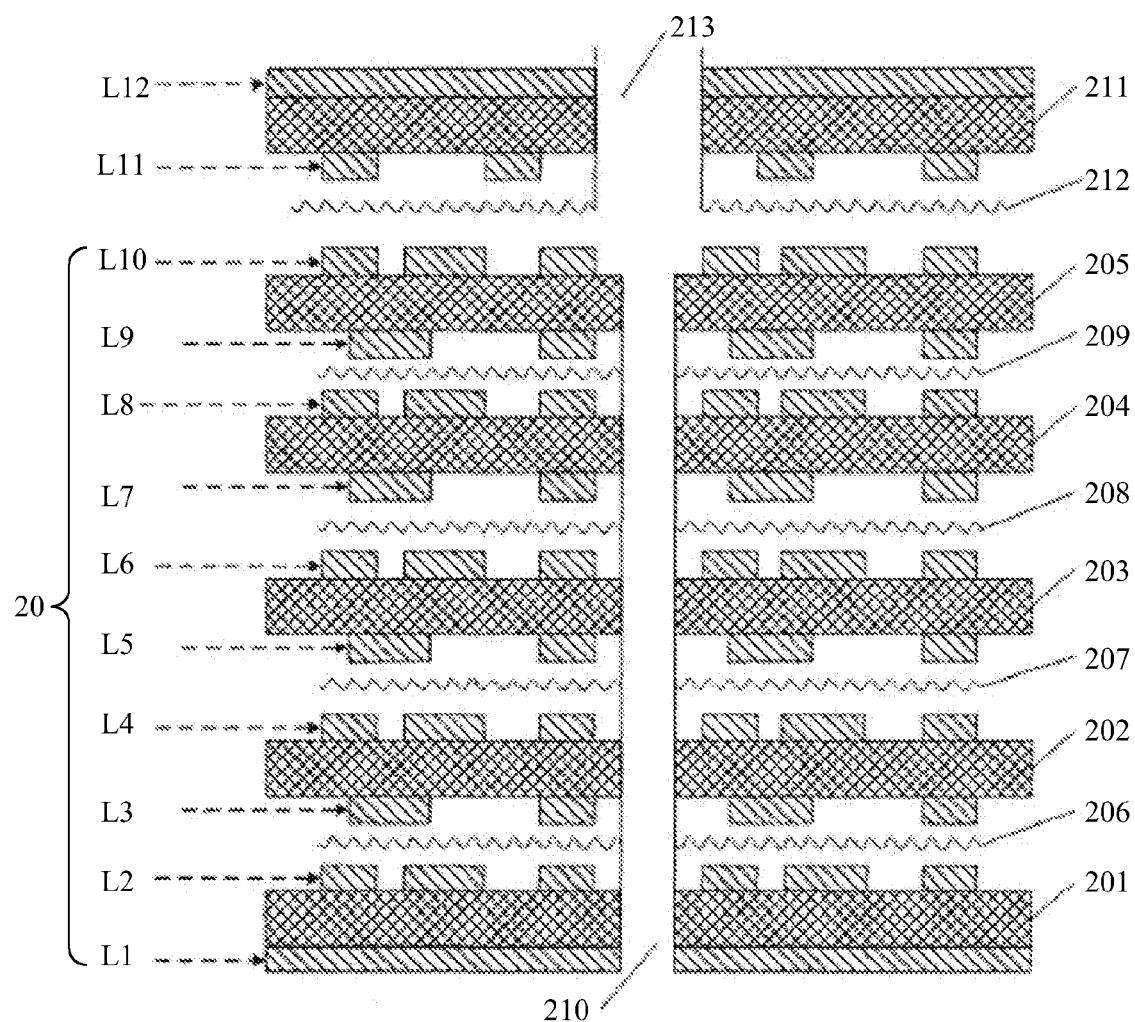
FIG. 3b is a schematic and exploded structural diagram of a stacked base board and a second base board of a PCB according to another embodiment.

In some embodiments, when opening the second window, edges of the resin layer are cut, leaving an edge connected with the resin layer, thus forming a bendable resin portion in the second window (as shown in FIG. 3a). In some other embodiments, when opening the second window, the resin layer in the second window are cut through to obtain a separate resin portion (as shown in FIG. 3b).

At step 103, the first base board, the second base board, and the resin layer therebetween are bonded.

At step 104, the heat dissipating copper conductor is buried in the first window in the first base board through the second window. For example, the heat dissipating copper conductor may be inserted through the second window by bending the bendable extension of the resin layer. Alternatively, in case the second window is a through hole in the resin layer, the heat dissipating copper conductor may be inserted into the first window via the through hole in the second window.

At step 105, a resin portion is placed at the bottom of the second window. For example, the bendable extension of the resin layer may be placed back so that it rests at the bottom of the second window. Alternatively, a resin portion fitting the second window may be provided at the bottom of the second window. The resin portion may be cut from the resin layer when opening the second window.

At step 106, the sub-board is embedded in the second window of the second base board.

Specific examples will be further described below to explain in greater details and more clearly the fabricating method according to the embodiments.

In step 101, as illustrated in FIG. 1, the first base substrate 201, the second base substrate 202, the third base substrate 203, the fourth base substrate 204 and the fifth base substrate 205, and the first resin layer 206, the second resin layer 207, the third resin layer 208 and the fourth resin layer 209 in the first base board 20 are provided with a first window 210, which matches in shape and size with a heat dissipating copper conductor. Although one window is provided in first base board 20 in the above example, more than one of windows may be provided in a first base board. First window 210 corresponding in shape and size to the copper conductor is provided in each of base substrates and each of resin layers in first base board 20.

With reference to FIGS. 3a and 3b, step 102 in FIG. 2 will be further explained. Specifically, a resin layer 212 is stacked on top of first base board 20. Further, a second base board 211 which includes an insulating layer 2112 and metal (e.g., copper) circuit layers L11, L12 on two sides of insulating layer 2112 is placed on top of resin layer 212. A second window 213 is provided in second base board 211 and second resin layer 212. The shape and the size of the second window 213 match with those of a sub-board to be embedded. In another embodiment, resin layer 212 may include one or more resin layers.

In some embodiments, second window 213 may include a bendable extension 215 of resin layer 212. An example is shown in FIG. 3a. In the preparation of second window 213, a portion of resin layer 212 corresponding to second window 213 may be cut but remain connected, at one edge, to resin layer 212 to form extension 215. For example, if second window 213 is a square, extension 215 may be formed by cutting three sides of the square of resin layer 212. With this, copper conductor 214 may be inserted in first window 210 (from second window 213) by bending bendable extension 215.

In some embodiments, the resin portion that is cut from the resin layer 212 in the second window 213 may be removed, as shown in FIG. 3b.

Next, first base board 20 and second base board 211 are bonded through resin layer 212, thus resulting in a structure as illustrated in FIG. 3a or 3b.

Figure 4A:
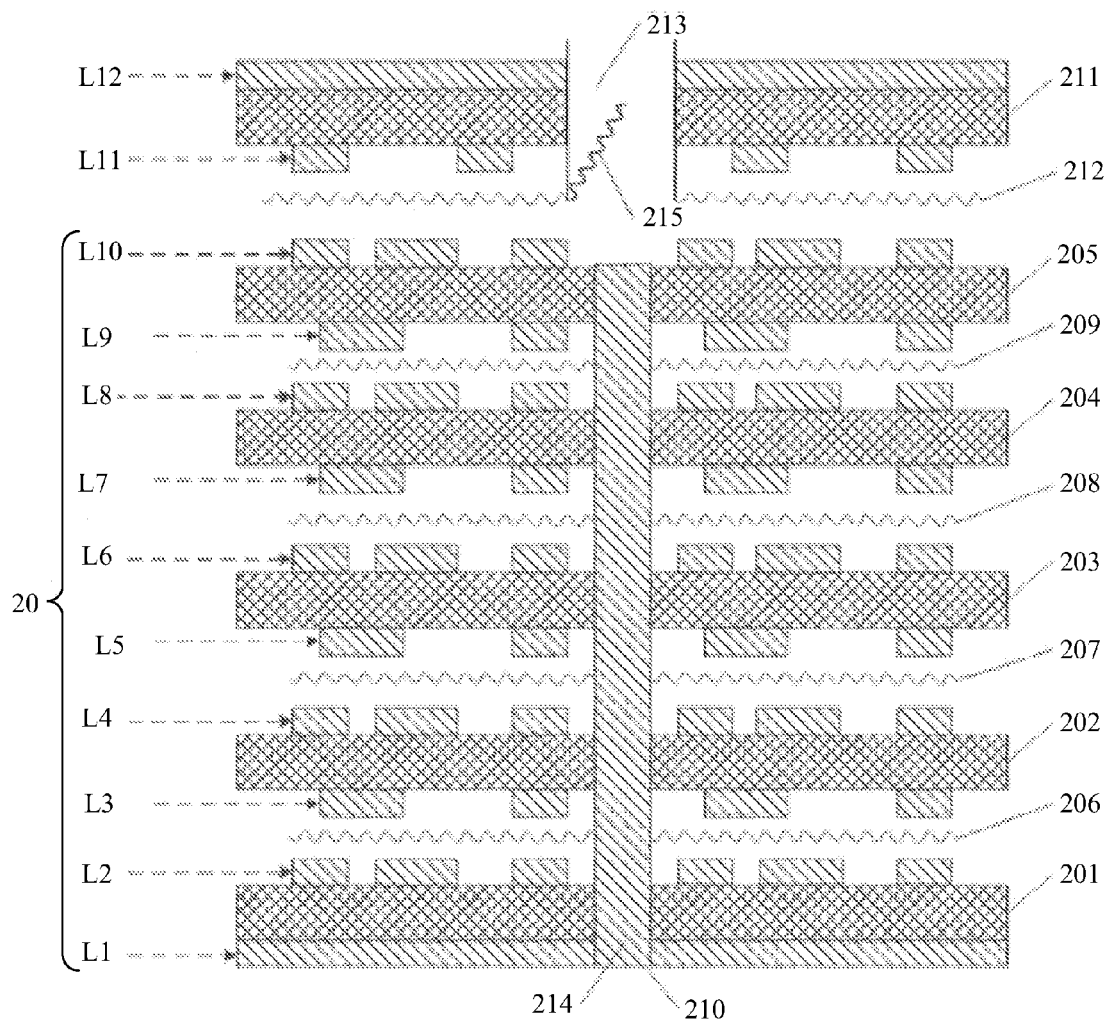
FIG. 4a is a schematic and exploded structural diagram of a PCB according to an embodiment.
Figure 4B:
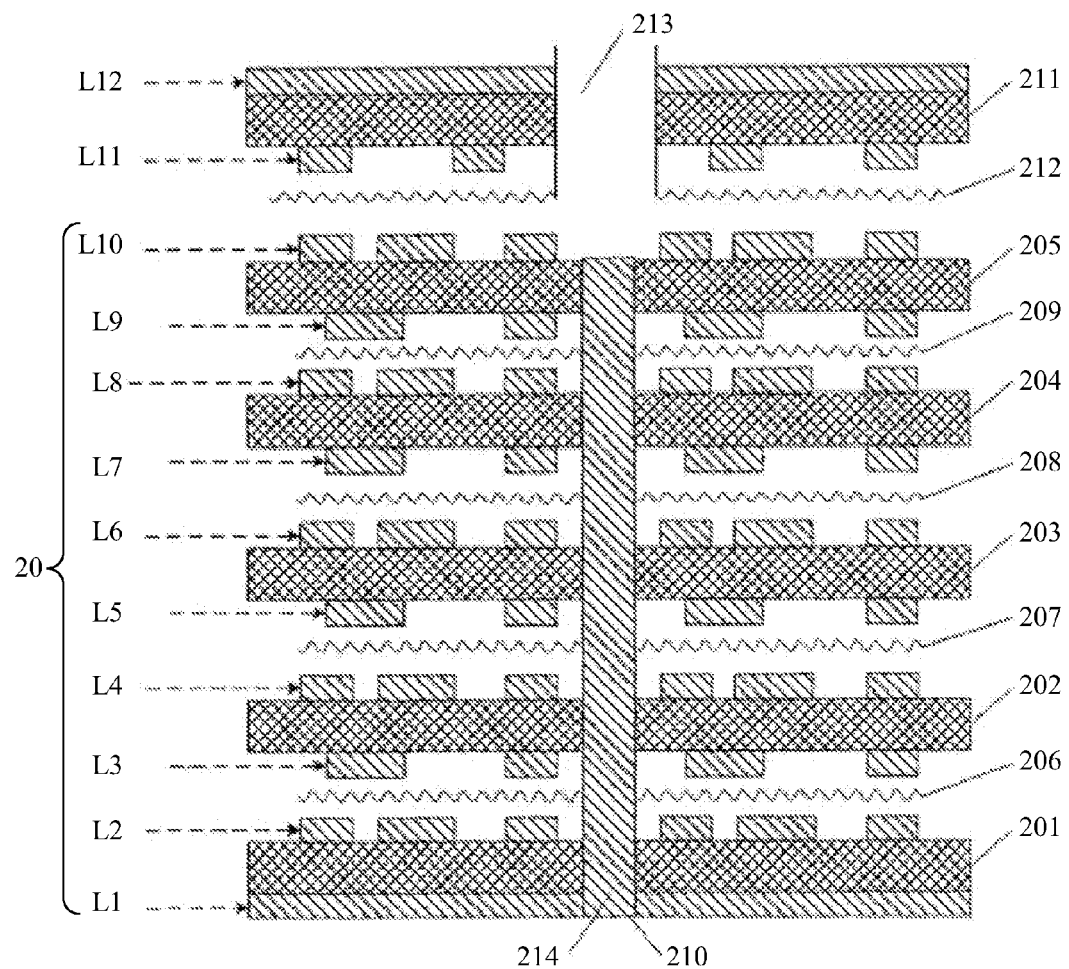
FIG. 4b is a schematic and exploded structural diagram of a PCB according to another embodiment.

In step 104, a heat dissipating copper conductor 214 is buried in the first window 210 of first base board 20. FIGS. 4a and 4b each show a structural diagram of a PCB in which the heat dissipating copper conductor 214 is buried. Specifically, in FIG. 4a, bendable extension 215 of resin layer 212 is bended to open a path to first window 210 and heat dissipating copper conductor 214 is inserted in first window 210. Alternatively, as shown in FIG. 4b, heat dissipating copper conductor 214 is inserted in first window 210 via a through hole in resin layer 212.

Figure 5:
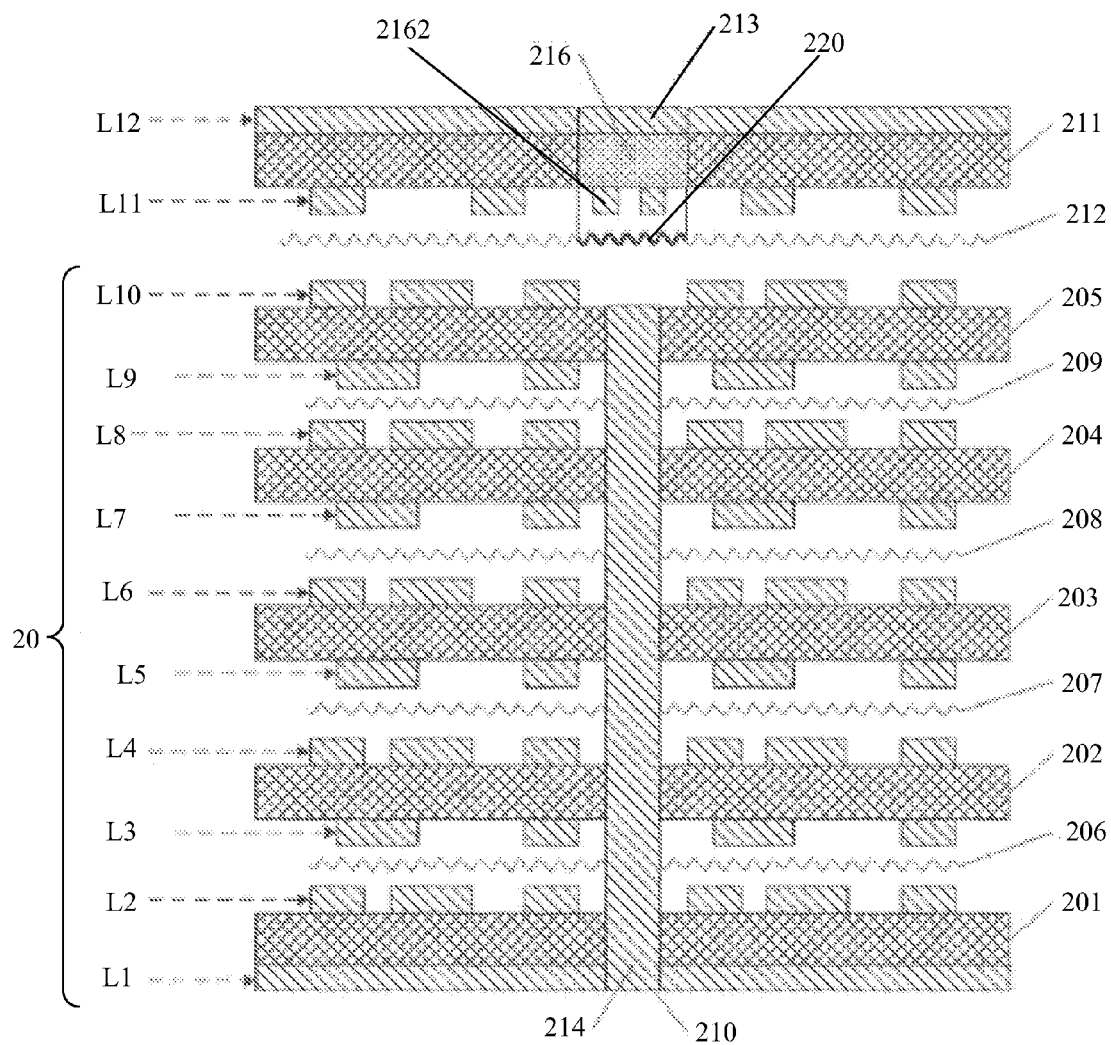
FIG. 5 is a schematic and exploded structural diagram of a PCB according to an embodiment.

Referring to FIG. 5, after heat dissipating copper conductor 214 is buried in first window 210, a resin portion 220 and a sub-board 216 is further buried in second window 213 in the steps 105 and 106, respectively. Resin portion 220 may be an extension of resin layer 212, such as the bendable extension 215 as shown in FIGS. 3a and 4a. Alternatively, resin portion 220 may be a separate resin portion, for example, cut from resin layer 212 when opening the second window. Sub-board 216 may be, for example, a high frequency sub-board or a sub-board at another frequency in some embodiments. Sub-board 216 may include elements 2162 such as metal pattern or electronic devices. Sub-board 216 may be bonded with the combined first base board 20 and second base board 211 through resin block 220.

In another embodiment, after the step 105 and the step 106 are performed, the surface of the entire PCB is coated with a release agent which is further dried to form a release film (not shown). Additional processing step may include laminating an aluminum sheet and a steel board on the release film-coated PCB on the side of second base board 211 (not shown). An aluminum sheet can prevent excessive bonding agent from overflowing, and assist in other desirable handling processes, e.g., further coating and etching, etc.

As illustrated in FIG. 5, the location of the heat dissipating copper conductor 214 corresponds to the location of the sub-board 216. Second window 213 is used to embed the sub-board 216 therein. In addition, heat dissipating copper conductor 214 may also be buried in first base board 20 through the second window 213. Thus, the boundary of the first window 210 may not go beyond that of the second window 213. That is, all boundary of first window 210 may be within the boundary of second window 213. If more than one of heat dissipating copper conductors 214 is required to be buried in first base board 20, more than one first window 210 may be provided in first base board 20. In one embodiment, the size of second window 213 may be large enough to cover all boundaries of a plurality of first windows 210 corresponding to the heat dissipating copper conductors 214.

In some embodiments, the size of first window 210 may be slightly larger than that of the heat dissipating copper conductor 214, for example, by 3-6 mils. Further, the size of second window 213 may be slightly larger than that of the sub-board 216, for example, by 3-6 mils.

In some embodiments, one sub-board 216 may correspond to one heat dissipating copper conductor 214 or a plurality of heat dissipating copper conductors 214. If more than one heat dissipating copper conductors are used, the number of first windows 210 is designed to be consistent with the number of heat dissipating copper conductors 214. For example, each of heat dissipating copper conductors 214 may correspond to a location of one power amplifier. When a plurality of power amplifiers are present on the sub-board 216, corresponding heat dissipating copper conductors 214 can dissipate heat of the plurality of power amplifiers.

Figure 6:
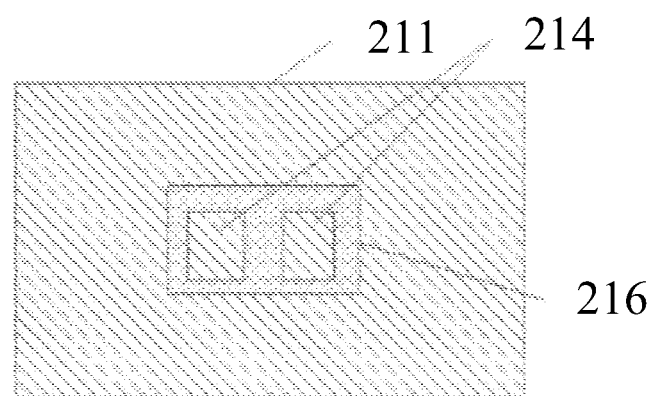
FIG. 6 is a top view of a PCB according to an embodiment of the invention.

In order to enable the heat dissipating copper conductor 214 to contact directly with a power amplifier on the sub-board 216 for better heat dissipation, one or more openings may be provided in the sub-board 216 so that the heat dissipating copper conductor 214 can be exposed. The location, size and shape of the openings in sub-board 216 may correspond to those of heat dissipating copper conductor 214. An example is shown in FIG. 6. FIG. 6 depicts two heat dissipating copper conductors 214 in a top view of the PCB. Sub-board 216 is embedded in second base board 211. A portion of sub-board 216 is opened to expose copper conductors 214 so that copper conductors may be in direct contact with heat generating devices, such as power amplifiers to dissipate heat rapidly.

According to some other embodiments, a PCB includes a first base board (e.g., a stacked base board) including at least two first base substrates, a first resin layer sandwiched between the two first base substrates, and a first window traversing the at least two first base substrates and the first resin layer. The PCB further includes a heat dissipating copper conductor buried in the first window. The PCB further includes a second base board having a second window corresponding to and larger than the first window. The PCB further includes a sub-board embedded in the second window. The shape and size of the sub-board match with those of the second window. The PCB further includes a second resin layer located between the first base board and the second base board. The second resin layer is also provided with the second window. The PCB further includes a third resin layer interposed between the sub-board and the stacked base board. The third resin layer may be an extension of the second resin layer in the second window. The third resin layer may be bendable from the second resin layer so that an object may pass through the third resin layer.

Furthermore, an opening matching in location, shape and size with the heat dissipating copper conductor is provided on the sub-board. The PCB may include more than one heat dissipating copper conductor. In another embodiment, the number of the opening may be consistent with that of the heat dissipating copper conductors.

Further, the PCB board may include an aluminum sheet on the second base board.

A PCB board may be fabricated in the methods described in this disclosure. As the fabricating methods in the embodiments of this disclosure are explained in details, the structure of PCBs fabricated therefrom can be readily apparent to those skilled in the art and redundant descriptions will be omitted for conciseness of the specification.

As described above, a second window in the second resin layer may be formed by cutting a portion of the second resin layer so that the cut portion remain connected with the second resin layer and is bendable. Heat dissipating copper conductors may thus be inserted in the first window through the second window and the bendable portion of the second resin layer. Thus, problems in fabricating a hybrid PCB such as requiring a large amount of labor to stack base boards, low efficiency, and complicated production schedule due to the need of flipping boards over, may be eased.

Furthermore, a process of providing a bendable portion in a resin layer may require less efforts than a process of flipping over a stacked board in order to embed a heat dissipating conductor, thereby reducing the technical difficulties in fabricating a hybrid PCB.

Only exemplary embodiments have been described above. The descriptions are not intended to limit this disclosure. For those skilled in the art, the above embodiments may have various modifications and changes based on this disclosure. The modifications, equivalent substitutions, improvements and the like should fall in the scope of protection of this disclosure without departing from the spirit and principle of this disclosure.

What is claimed is:

1. A method of fabricating a printed circuit board, comprising:
   opening a first window in a first base board;
   opening a second window in a second base board and a resin layer, the resin layer being between the second base board and the first base board;
   bonding the first base board and the second base board through the resin layer;
   placing a heat dissipating conductor in the first window in the first base board through the second window;
   placing a resin portion on the first base board in the second window;
   embedding a sub-board in the second window of the second base board; and
   bonding the sub-board with the first base board through the resin portion.

2. The method according to claim 1, wherein opening a second window in a second base board and a resin layer comprises cutting the resin layer in the second window to form the resin portion.

3. The method according to claim 1, wherein opening a second window in a second base board and a resin layer comprises cutting the resin layer in the second window to form the resin portion, leaving a portion of the resin portion connected to the resin layer.

4. The method according to claim 3, wherein placing the heat dissipating conductor in the first window in the first base board through the second window comprises bending the resin portion to allow the heat dissipating conductor to be placed in the first window.

5. The method according to claim 1, wherein the first base board includes a plurality of base substrates and at least a resin layer interposed between the base substrates.

6. The method according to claim 1, wherein the heat dissipating conductor includes copper.

7. The method according to claim 1, further comprising:
   forming an opening matching in location, shape, and size with the heat dissipating conductor in the sub-board.

8. The method according to claim 1, wherein the sub-board includes a material suitable for a high frequency application.

9. A printed circuit board (PCB), comprising:
   a first base board including a first window;
   a heat dissipating conductor buried in the first window;
   a second base board on the first base board, the second base board having a second window corresponding to the first window;
   a sub-board embedded in the second window in the second base board;
   a resin layer interposed between the second base board and the first base board; and
   a resin portion interposed between the sub-board and the first base board.

10. The PCB according to claim 9, wherein the first base board includes at least two base substrates, a first resin layer sandwiched between the base substrates, and the first window traverses the base substrates and the first resin layer.

11. The PCB according to claim 9, wherein the heat dissipating conductor includes copper.

12. The PCB according to claim 9, wherein the sub-board includes an opening matching in location, shape, and size with the heat dissipating conductor.

13. The PCB according to claim 9, wherein the sub-board includes one or more heat dissipating conductors.

14. The PCB according to claim 9, wherein the resin portion is an extension from the resin layer.

15. The PCB according to claim 9, wherein the sub-board includes a material suitable for a high frequency application.

* * * * *